United States Patent [19]

d'Avitaya et al.

[11] Patent Number: 4,847,216
[45] Date of Patent: Jul. 11, 1989

[54] PROCESS FOR THE DEPOSITION BY EPITAXY OF A DOPED MATERIAL

[75] Inventors: Francois A. d'Avitaya, Meylan; Yves Campidelli, Grenoble, both of France

[73] Assignee: Centre National d'Etudes des Telecommunications, Moulineaux, France

[21] Appl. No.: 185,269

[22] Filed: Apr. 18, 1988

Related U.S. Application Data

[63] Continuation of Ser. No. 923,152, Oct. 14, 1986, abandoned.

[30] Foreign Application Priority Data

Feb. 28, 1985 [FR] France .................................. 85 02976

[51] Int. Cl.$^4$ ..................... H01L 21/203; C30B 23/02
[52] U.S. Cl. ............................. 437/105; 148/DIG. 2; 148/DIG. 41; 148/DIG. 46; 148/DIG. 169; 156/612; 427/35; 427/43.1; 437/168; 437/173; 437/935; 437/936; 437/951; 437/987
[58] Field of Search ..................... 148/DIG. 2, 41, 46, 148/56, 65, 169; 156/610, 612; 427/35, 51, 42, 53.1, 38, 43.1; 437/16, 105, 107, 22, 165, 168, 173, 935, 936, 951, 987

[56] References Cited

U.S. PATENT DOCUMENTS

| | | | |
|---|---|---|---|
| 4,071,383 | 1/1978 | Nagata et al. | 148/175 |
| 4,086,108 | 4/1978 | Gonda | 148/175 |
| 4,203,799 | 5/1980 | Sugawara et al. | 148/175 |
| 4,224,897 | 9/1980 | Dugdale | 118/50.1 |
| 4,234,356 | 11/1980 | Auston et al. | 148/1.5 |
| 4,238,525 | 12/1980 | Aichert et al. | 427/42 |
| 4,239,788 | 12/1980 | Beck | 427/35 |
| 4,281,030 | 7/1981 | Silfvast | 427/53.1 |
| 4,392,453 | 7/1983 | Luscher | 29/576 E |
| 4,639,377 | 1/1987 | Yamamoto | 427/38 |

FOREIGN PATENT DOCUMENTS

8101529  6/1981  European Pat. Off. ............. 427/35

OTHER PUBLICATIONS

Ota, "Silicon MBE", Thin Solid Films, vol. 106, No. 1/2, 1983, pp. 22–27.

Smit et al., "Silicon Molecular Beam Epitaxy on Arsenic-Implanted and Laser-Processed Silicon", Appl. Phys. Lett., 40(1), Jan. 1982, pp. 64–66.

Allen et al., "Summary Abstract: Properties of Several Types of Films Deposited by Laser", J. Vac. Sci. Technol., 20(3), Mar. 1982, pp. 469–470.

Primary Examiner—Brian E. Hearn
Assistant Examiner—William Bunch
Attorney, Agent, or Firm—Oblon, Fisher, Spivak, McClelland & Maier

[57] ABSTRACT

The process consists of depositing at least one layer of a doped material on a heated substrate placed in an enclosure, subjecting the substrate surface to the action of a molecular flux of the material, to the action of a doping particle beam and to the action of an electron beam.

10 Claims, 1 Drawing Sheet

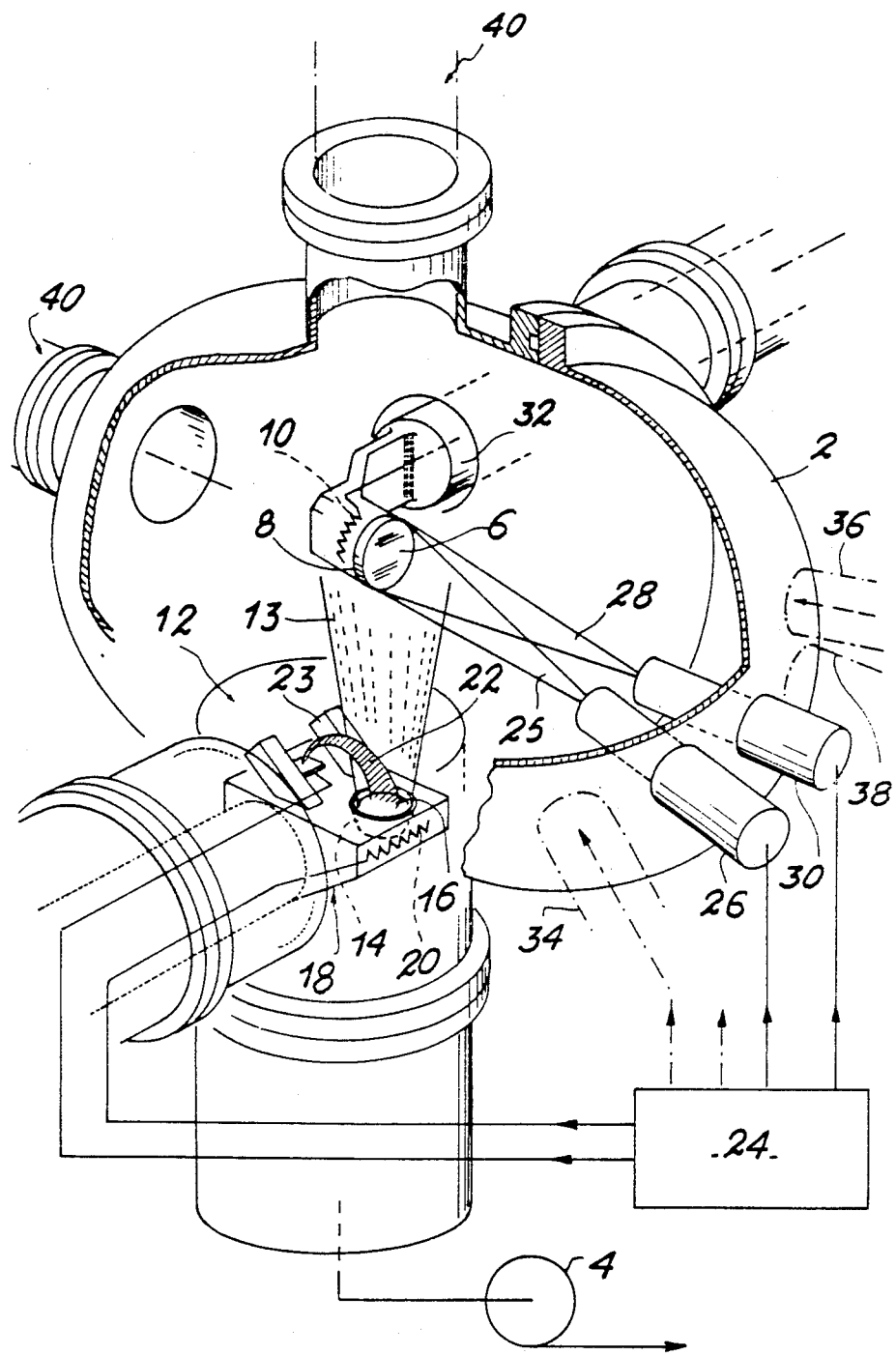

PROCESS FOR THE DEPOSITION BY EPITAXY OF A DOPED MATERIAL

This application is a continuation of application Ser. No. 923,157, filed on Oct. 14, 1986, now abandoned.

BACKGROUND OF THE INVENTION

The present invention relates to a process for the deposition by epitaxy of a doped material, as well as to an apparatus making it possible to perform this process.

It is more particularly used in the production of electronic or microelectronic components formed from several superimposed thin films, which are in particular semiconductive and which are differently doped. The main semiconductor materials used are silicon or III–V materials, such as gallium arsenide. The invention makes it possible to produce ultra-high frequency diodes, heterojunction lasers and very fast transistors, such as silicon—metal—silicon or SMS transistors, or permeable base transistors (base in the form of a gate).

The thin semiconductive films are generally produced by epitaxy on a monocrystalline semiconductor substrate. The presently known epitaxy methods are liquid phase epitaxy (LPE), chemical vapour phase epitaxy (CVD) and molecular beam epitaxy (MBE).

Among these different epitaxy methods, molecular jet epitaxy has intrinsically higher performance levels, particularly for obtaining very thin films of a few nanometers, with a perfectly planar surface and a very abrupt interface. A molecular beam epitaxy process and apparatus are described in an article by Y. OTA, published in J. Appl. Phys, 51(2), February 1980, pp 1102–1110 entitled "Silicon molecular beam epitaxy with simultaneous ion implant doping".

In this method, in a tight enclosure are formed molecular fluxes or beams of the material to undergo epitaxy, e.g. silicon and the heated substrate is subject to the action of these molecular beams, as well as to the action of a doping particle beam.

The substrate heating temperature is relatively low (600° to 850° C.) compared with other deposition processes and particularly chemical vapor phase deposition process (1000° to 1200° C.). At this low temperature, there is no diffusion of the doping particles and consequently it is possible to produce differently doped superimposed layers with an extremely abrupt doping profile, which is indispensable for fast components.

However, this deposition procedure causes a certain number of problems, particularly with respect to the doping of semiconductor layers. Thus, for certain doping particles, e.g. arsenic, phosphorus antimony, etc, used for a p-type doping of the silicon, a very disturbing phenomenon appears. In particular, the doping material is evaporated in the form of molecular of type $X_4$ ($As_4$, $P_4$, etc) and at the relatively low substrate heating temperature of 600° to 850° C., there is a doping gas vapour tension, which has the effect that a majority of the doping molecules which touch the surface of the semiconductor layer undergoing epitaxy, do not integrate with said layer and instead return to the doping gas.

It has been possible to determine a "bonding coefficient" which is in practice approximately $10^{-4}$, i.e. one doping atom is integrated with the layer undergoing epitaxial growth for 10,000 atoms on the surface thereof. This low "bonding coefficient" makes it necessary to inject into the epitaxy enclosure, in which there is a very high vacuum, a large amount of a doping gas, which is incompatible with the need of maintaining an ultra-high vacuum.

One of the presently proposed solutions for increasing the "bonding coefficient" on the substrate to undergo epitaxy consists of polarizing said substrate. This substrate polarization makes it possible to attract ionized doping particles which then strike the substrate surface. Unfortunately, this bombardment of ionized particles leads to damage to the epitactic layer by producing numerous crystalline faults in said layer, which can bring about the formation of a substantially amorphous layer (sputtering effect).

SUMMARY OF THE INVENTION

The present invention specifically relates to a process for deposition by epitaxy of a doped material and to an apparatus for performing this process making it possible to obviate the disadvantages referred, to hereinbefore. According to the molecular beam epitaxy procecure, it makes it possible to produce a doped epitactic layer, whose dopoing agent has a "bonding coefficient" close to 1, without leading to the formation of crystalline defects in said layer.

More specifically, the invention relates to a process for the deposition by epitaxy on the surface of a substrate of a layer of a doped material, consisting of heating the substrate in a tight enclosure and subjecting the surface of said substrate to the action of a molecular flux of said material and to the action of a beam of doping particles, wherein at least part of the substrate surface is irradiated with an electron beam of given intensity.

Although the physiocochemical phenomena occurring on the substrate surface are not perfectly known, this process makes it possible to obtain an epitactic layer of very high quality and which is effectively doped, bearing in mind that the doping gas then has a "bonding coefficient" close to 1. The electron bombardment of the substrate surface then leads to an increase in the concentration of the doping of the epitactic layer in a proportion 1 to 10,000.

Moreover, this electron bombardment makes it possible to reduce the substrate heating temperature. In particular, the deposition of a doped silicon layer can be carried out by only heating the substrate, particularly of silicon, to a temperature between 600° and 800° C. instead of between 800° and 850° C.

The advantages resulting from the invention are linked with the use of an electron beam. Thus, research carried out by the inventors has revealed that the bombardment of the substrate with a light beam, e.g. a laser beam, does not make it possible to obtain the same results.

The process according to the invention makes it possible to deposit doped semiconductor layers. It advantageously applies to the deposition of silicon layers of the p-type, e.g. doped with arsenic, phosphorus or antimony, or of the n-type doped with boron, as well as to the deposition of layers of III–V material, such as gallium arsenide, indium or gallium phosphide, doped with metallic elements, e.g. zinc, berylliuum or tin.

These layers are preferably deposited on a monocrystalline semiconductor substrate. One of the main conditions for the deposition by epitaxy of a random monocrystalline layer on a random monocrystalline substrate is that the mesh of the substrate has dimensions and a geometry close to those of the epitactic layer.

According to a preferred embodiment of the inventive process, the molecular flux of the material constituting the layer to undergo epitaxy is formed by the irradiation of a target of said material with an electron beam.

The inventive process makes it possible to produce on the same substrate several superimposed layers of the same material, and in particular a monocrystalline material, which are differently doped e,g, with an extremely abrupt transition of the dopant concentration (a few atomic films), solely by suddenly modifying the intensity of the electron beam during the epitaxy of the layers. It is also possible to define on the substrate very precise geometrical zones, whose doping particle concentration differs, by supplying the electron beam solely to said zones. The term differently doped layers is understood to mean both type n or p-layers of + or − sign and layers of the same type, whose dopant concentration ranges between $10^{15}$ and $10^{19}$ atoms/cm$^2$.

The invention also relates to an apparatus making it possible to perform the aforementioned process and which comprises, in a tight enclosure, means for supporting the substrate, means for heating the substrate, means for supporting at least one target of said material, means for heating said target for forming a molecular flux of said material, means for forming at least one doping particle beam and an electron source irradiating at least part of the substrate surface.

DESCRIPTION OF THE DRAWING AND PREFERRED EMBODIMENTS

Other features and advantages of the invention can be gathered from the following illustrative and non-limitative description of the invention, relative to the single perspective view of an epitaxy apparatus permitting the performance of the process according to the invention.

The process according to the invention firstly consists of producing in a tight enclosure 2 an ultra-high vacuum, e.g of $5.10^{-11}$ tor ($6.7 \cdot 10^{-9}$ Pa). For this purpose, enclosure 2 is connected to a conventional vacuum pump 4. A substrate 6 on which epitaxy is to take place of the layers to be deposited, e.g. a silicon monocrystal, is placed within enclosure 2 on a support 8 provided for this purpose. Heating means 10, such as a heating filament located within support 8, make it possible to raise the temperature of substrate 6. In the case of a monocrystalline silicon substrate, the heating temperature is between 600° and 800° C., which is below that used in the prior art.

In a tight enclosure 2 is placed an evaporation apparatus 12 making it possible to produce a molecular flux or beams 13 of the material which is to form the layer or layers to undergo epitaxy on substrate 6. The evaporation apparatus is more particularly described in U.S. Pat. No. 4,303,694.

In simplified form, apparatus 12 comprises a refractory material crucible 14 containing the material 16 for forming the layer to undergo epitaxy, located in a support 18 equipped with means 20 for heating crucible 14. An electron beam 22, emitted by a known source, e.g. located in support 18 is transmitted using an appropriate deflecting system 23, such as magnets, to the material 16. Means 24 make it possible to control the heating of crucible 14 (temperature, duration) as well as the electron bombardment 22 (irradiation time, intensity, positioning of the beam).

In order to obtain a doped epitactic layer, within enclosure 2 is produced a doping particle beam 25 emitted by a source 26, like the known Knudsen cell.

In order to obtain an effective doping of the epitactic layer and in particlar a "bonding coefficient" close to 1, according to the invention, during epitaxy, all or part of the surface of substrate 6 is subject to the action of an electron beam 28, produced by a known electron channel 30.

Means 24 also make it possible, to suddenly modify the intensity of electron beam 28, or even stop it completely during the epitaxy of the layer, in order to modify in a very precise manner the concentration of dopants in the epitactic layer. Moreover, by only subjecting certain parts of the surface of substrate 6 to the action of electron beam 28, it is possible to very accurately define geometrical zones having a varying dopant concentration.

Furthermore, in order to produce several superimposed layers of the same material on the same substrate 6 and which are doped with different dopants, it is possible to produce other doping particle sources such as 34, 36 and 38 within enclosure 2. The control of the different dopant sources is e.g. assured by means 24.

Means 32 for controlling the support of substrate 6 make it possible to orient the substrate surface, on which epitaxy of the different doped layers is to take place, with respect to the electron beam 28, the doping particle beams 25 and the molecular flux 113. With respect to enclosure 2, different measuring and analysis means 40 make it possible to check the deposition of the layers, as well as the doping thereof.

The inventive process is advantageously applicable to the deposition on a monocrystalline silicon substrate of monocrystalline silicon layers, more particularly doped with arsenic, phosphorus or antimony in the case of n-type layers, or doped with boron in the case of p-type layers.

It is possible with the process according to the invention to obtain an antimony-doped monocrystalline silicon epitactic layer with a concentration of $3.10^{19}$ atoms/cm$^2$, by using an electron beam 28 with an energy of 100V and an electron current of 10 to 100 $\mu$A/cm$^2$. The antimony doping particles are obtained by heating a Knudsen cell to 300° C. and the molecular silicon flux is is obtained at an evaporation rate of 1 $\mu$m/h. The monocrystalline silicon substrate temperature is 730° C.

All other things being equal, the elimination of the electron beam 28 leads to a doping of $2.10^{17}$ instead $3 \cdot 10^{19}$ atoms/cm$^2$.

The above description has been given in a non-limitative nature and all modifications thereto not passing beyond the scope of the invention can be envisaged.

In particular, the epitaxy substrate and the layers to undergo epitaxy can be produced from a material other than monocrystalline silicon. The substrate and epitactic layers can in particular be produced from gallium arsenide, indium or gallium phosphide. Furthermore, it is possible to replace the Knudsen cell constituting the doping particle source by a simple target of said material subject to electron bombardment.

What is claimed is:

1. A process for depositing a semiconductor layer of a doped material on the surface of a substrate by epitaxy, consisting essentially of:
   heating said substrate in a tight enclosure;
   forming a beam of doping unionized particles of an aggregate molecular structure of the type $X^4$ by evaporation;
   forming an electron beam of a determined density;

forming a molecular flux of said material which constitutes said semiconductor layer; and subjecting the substrate surface to the combined action of said molecular flux and said particle beam while simultaneously irradiating at least a portion of the substrate surface with said electron beam in order to increase the quantity of doping particles within the portion of the material layer exposed to said electron beam.

2. The deposition process according to claim 1, wherein the material is a semiconductor material.

3. The deposition process according to claim 1, wherein the material is of silicon or a III–V material.

4. The deposition process according to claim 3, wherein the doping particles are particles of arsenic, phosphorus, antimony or boron for a silicon material.

5. The deposition process according to claim 1, wherein the substrate is a monocrystalline semiconductor material.

6. The deposition process according to claim 1, wherein the substrate is of silicon or a III–V material.

7. The deposition process according to claim 1, wherein the substrate is heated to a temperature between 600° and 800° C.

8. The deposition process according to claim 1, wherein the molecular flux of said material is formed by the irradiation of a target thereof with an electron beam.

9. A process for the deposition according to claim 1 of several layers of the same material doped in a different way, wherein the intensity of the electron beam and/or the doping particle beam is suddenly modified.

10. A process for depositing a semiconductor layer of a doped material on the surface of a monocrystalline silicon substrate by epitaxy, consisting essentially of:

heating said substrate in a tight enclosure;

forming a beam of dopoing unionized particles of an aggregate molecular structure of the type $X_4$ by evaporation of an element selected from the group consisting of arsenic, phosphorus, antimony and boron;

forming an electron beam of a determined density;

forming a molecular flux of the material which constitutes said semiconductor layer; and subjecting the substrate surface to the combined action of said molecular flux and said particle beam while simultaneously irradiating at least a portion of the substrate surface with said electron beam in order to increase the quantity of doping particles within the portion of the material layer exposed to said electron beam.

* * * * *